(12) United States Patent
Lee et al.

(10) Patent No.: US 7,191,418 B2
(45) Date of Patent: Mar. 13, 2007

(54) METHOD AND APPARATUS FOR RAPIDLY SELECTING TYPES OF BUFFERS WHICH ARE INSERTED INTO THE CLOCK TREE FOR HIGH-SPEED VERY-LARGE-SCALE-INTEGRATION

(75) Inventors: Herng-Jer Lee, Tao-Yuan (TW); Chia-Chi Chu, Tao-Yuan (TW); Wu-Shiung Feng, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 232 days.

(21) Appl. No.: 10/889,510

(22) Filed: Jul. 12, 2004

(65) Prior Publication Data

US 2006/0010414 A1 Jan. 12, 2006

(51) Int. Cl.
*G06F 17/50* (2006.01)

(52) U.S. Cl. ............................. 716/6; 716/10
(58) Field of Classification Search .................. 716/2, 716/6, 10–11, 18
See application file for complete search history.

(56) References Cited

U.S. PATENT DOCUMENTS

| | | | |
|---|---|---|---|
| 5,564,022 A | 10/1996 | Debnath et al. | 395/250 |
| 5,638,291 A | 6/1997 | Li et al. | 364/490 |
| 5,974,245 A | 10/1999 | Li et al. | 395/500.11 |
| 6,550,044 B1 * | 4/2003 | Pavisic et al. | 716/6 |
| 2004/0168140 A1 * | 8/2004 | Chang | 716/6 |

* cited by examiner

*Primary Examiner*—Paul Dinh
(74) *Attorney, Agent, or Firm*—Alan D. Kamrath; Nikolai & Mersereau, P.A.

(57) ABSTRACT

A method and apparatus for rapidly selecting types of buffers which are inserted in the clock tree for high-speed VLSI design is disclosed. The developed tool can be embedded in the existing clock tree synthesis design flow to ensure minimizing the clock delay and satisfying the clock skew constrains. Given the clock tree netlist, the inserted buffers location information, the wire electrical parameters and a buffers timing library, the components delay (buffer delay and wire delay) of the clock tree can be calculated first. Then, for each I/O pin, the path delay, the clock delay and the clock skew can be obtained. Finally, using the method, a modified clock tree netlist satisfying the timing specifications can be constructed.

3 Claims, 12 Drawing Sheets

(a)

(b)

(a)

(b)

METHOD AND APPARATUS FOR RAPIDLY SELECTING TYPES OF BUFFERS WHICH ARE INSERTED INTO THE CLOCK TREE FOR HIGH-SPEED VERY-LARGE-SCALE-INTEGRATION

BACKGROUND OF THE INVENTION

1. Field of the Invention

The present invention relates to a method and apparatus for rapidly selecting types of buffers that are inserted into the clock tree and, more particularly, to a method and apparatus for rapidly selecting types of buffers that are inserted into the clock tree for high-speed very-large-scale-integration (VLSI).

2. Description of Related Art

The current high-speed VLSI usually uses the clock frequency as a target of the speed for data processing. The clock frequency is the frequency of the clock signal in the logic changing between 0 and 1. In a digital circuit, a clock net needs to transmit a clock signal from a dispatching point to a receiving point of any synchronous system of the digital circuit to make the synchronous systems synchronously operated under a timing design standard.

With reference to FIG. 1a that shows an inner structure of a simple IC wafer, the macro cells 14 in the wafer have finished floorplaning, and each cell has finished placement. The clock signal is transmitted from an exterior to an interior of the wafer via a pad 10 and to multiple pins of each of the macro cells 14 via a clock net 12. In each macro cell 14, the clock net 12 continually extends to each part of a subsidiary synchronous system.

In the process of transmitting signal, the signal integrity must be maintained as much as possible, that is, the clock delay and clock skew need to be possibly miniaturized. Shorteninig the clock delay can promote the speed of transmitting the clock signal. A signal error and a logical error may occur when the clock skew is over the standard value.

FIG. 1b is an exploded view of FIG. 1a. The input pad 10 of the clock signal is called a root. The received end of a flip-flop 16 is called a leaf. A complete path is formed to contain buffers and connecting circuits from the pad 10 (root) to the clock signal receiving end B1.1 (leaf) of the flip-flop 16. The accumulated delays of the buffers and the connecting circuits are called path delay. The path delays of two paths, respectively, connected to the roots (B1.1 and F 1.3) are one set of a clock skew. A buffer 18 is inserted to the clock net 12 for reducing time delay and the clock skew of each path of the clock tree.

FIG. 2 is an IC design flow chart of U.S. Pat. Nos. 5,564,022, 5,638,291 and 5,974,245. The conventional design usually processes placement 21 and coil 25. The current design adds the composing steps 22, 23 and 24 into the layout design. However, all the inserted buffers are in one type as shown in FIG. 2. The various buffers of the timing library are not considered. Consequently, the timing control of the clock tree net cannot fully satisfy the timing design standard.

SUMMARY OF THE INVENTION

The main objective of the present invention is to provide an improved method and apparatus for rapidly selecting types of buffers that are inserted into the clock tree for high-speed VLSI.

To achieve the objective, the present invention inserted in the clock tree for high-speed VLSI design is disclosed. The developed tool can be embedded in the existing clock tree synthesis design flow to ensure minimizing the clock delay and satisfying the clock skew constrains. Given the clock tree netlist, the inserted buffers location information, the wires electrical parameters and the buffers timing library, the components delay (buffer delay and wire delay) of the clock tree can be calculated first. Then, for each I/O pin, the path delay, the clock delay and the clock skew can be obtained. Finally using the proposed method, a modified clock tree netlist satisfying the timing specifications can be constructed.

Further benefits and advantages of the present invention will become apparent after a careful reading of the detailed description with appropriate reference to the accompanying drawings.

DETAILED DESCRIPTION OF THE INVENTION

Figure 1:
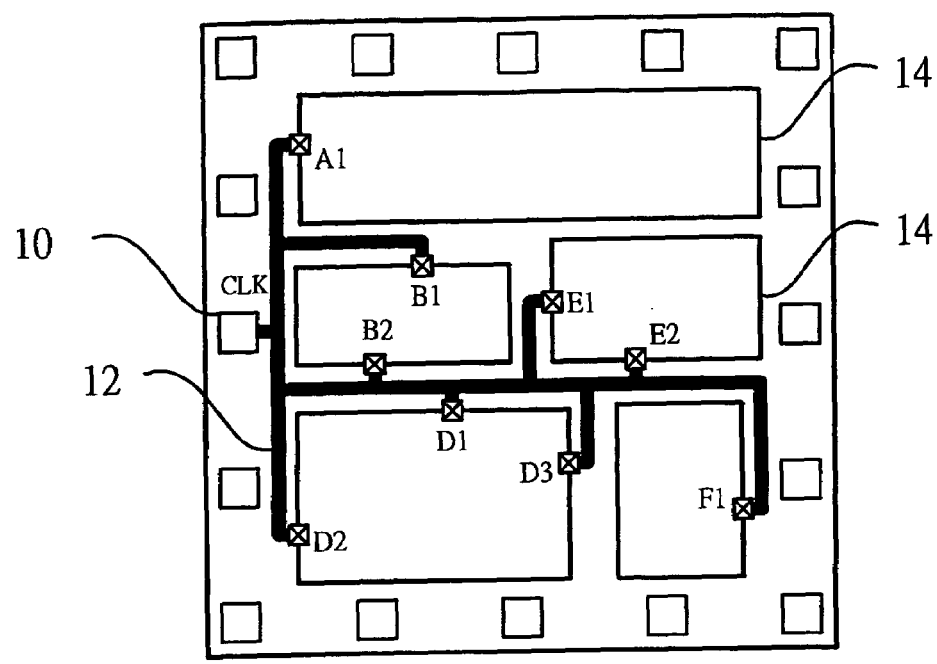
FIG. 1 shows an simple inner structure of an integrated circuit wafer in (a) and an expanding view of a clock tree netlist of (a) in (b)
Figure 1:
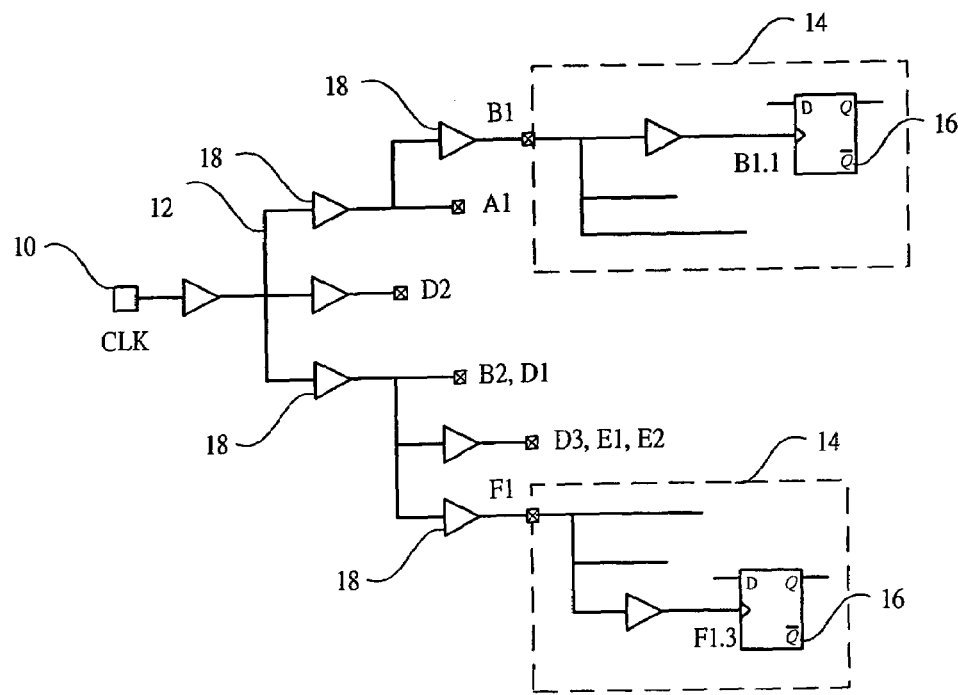
Figure 2:
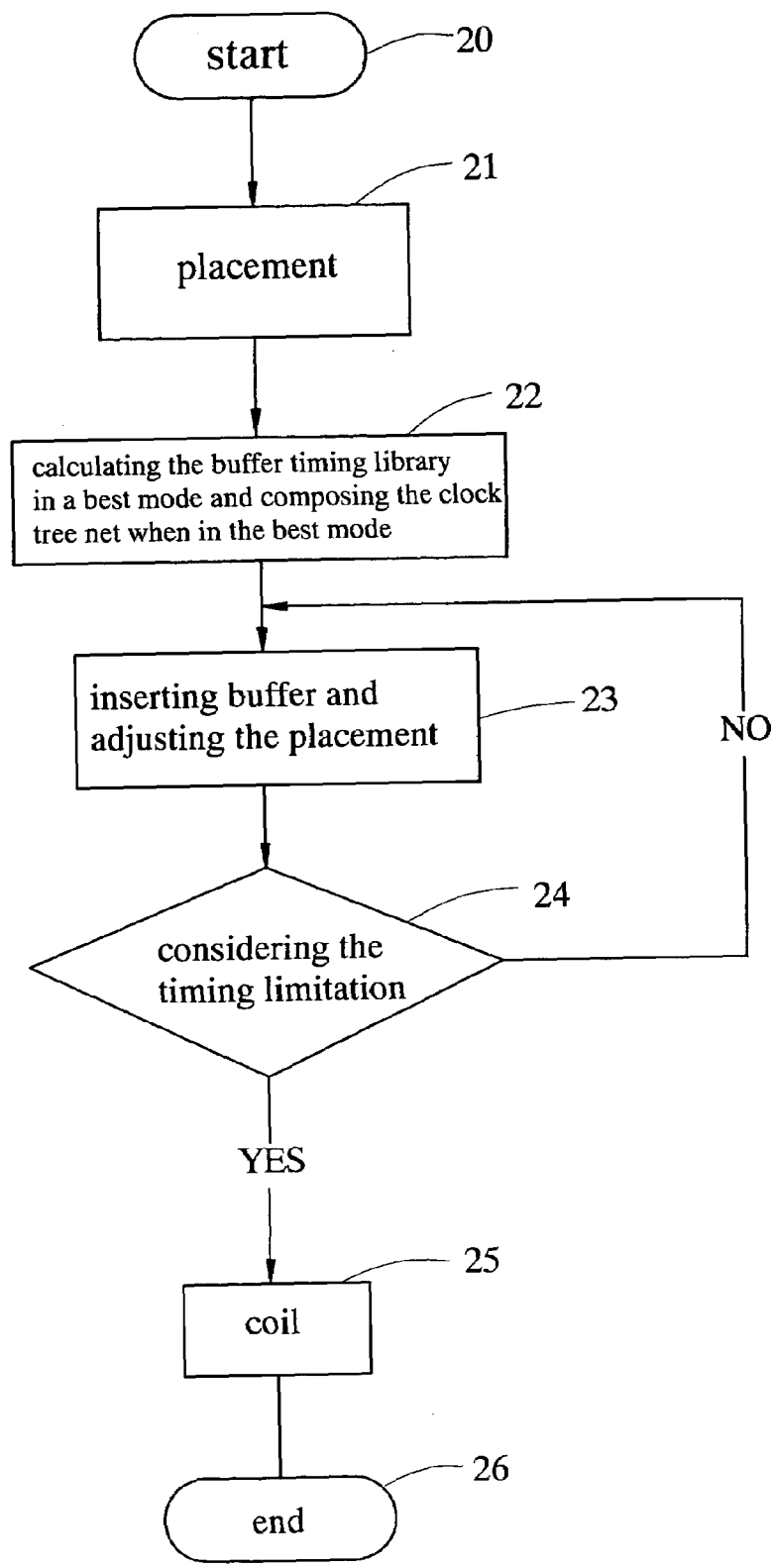
FIG. 2 is a flow chart for designing an integrated circuit.
Figure 3:
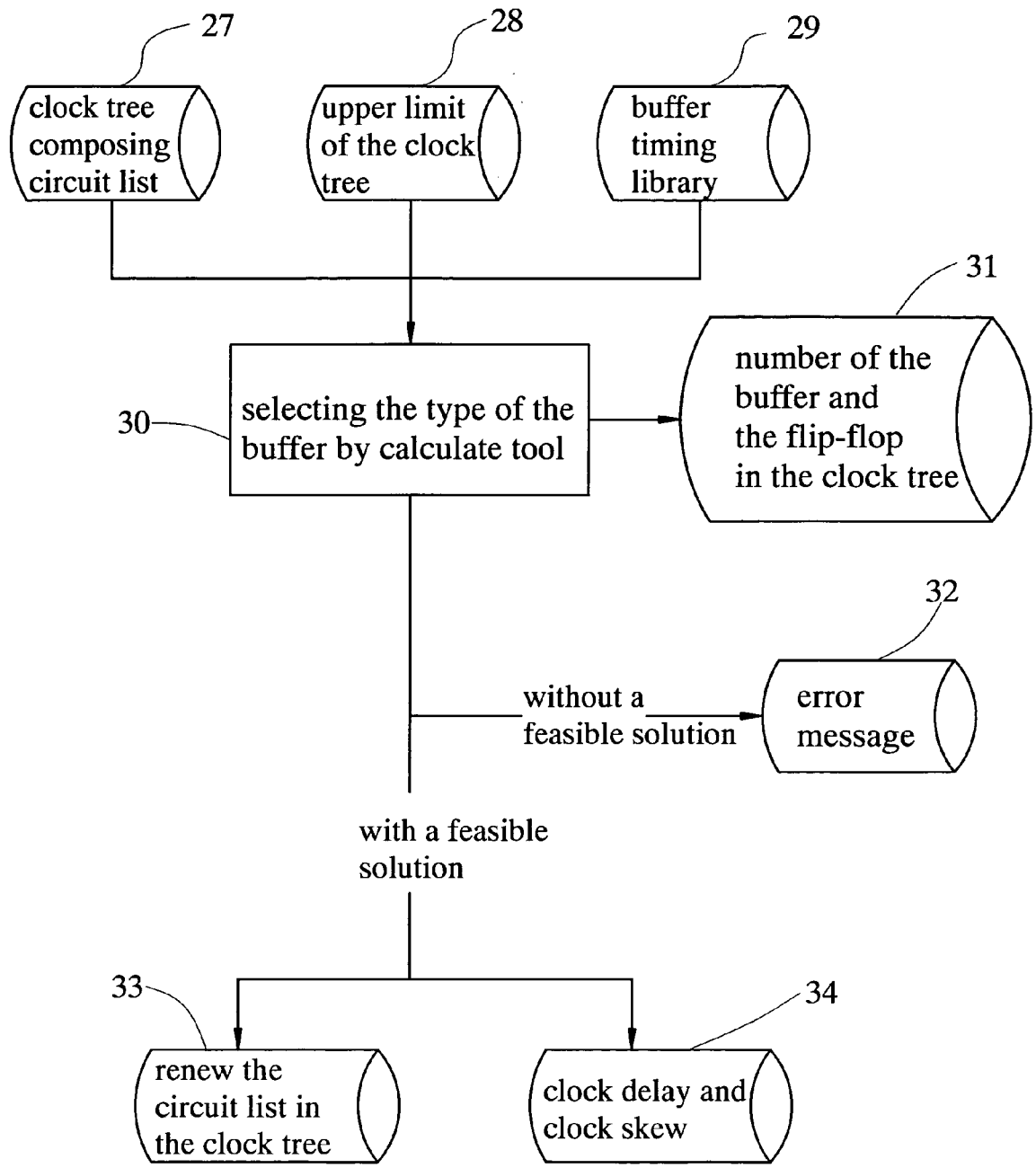
FIG. 3 is an input-output block chart of a calculating tool of the present invention.

The present invention relates to a method and apparatus for rapidly selecting types of buffers that are inserted into the clock tree for high-speed very-large-scale-integration (VLSI). With reference to FIG. 3, the netlist 27 of the clock tree is inputted. The upper limit 28 of the clock skew under design standard and the buffer timing library 29 are calculated in a best mode via the present invention. The netlist 27 of the clock tree of the renewed buffer and the clock delay and the clock skew of the clock tree are outputted when there is a feasible solution. An error signal is outputted when there is no feasible solution.

Figure 4:
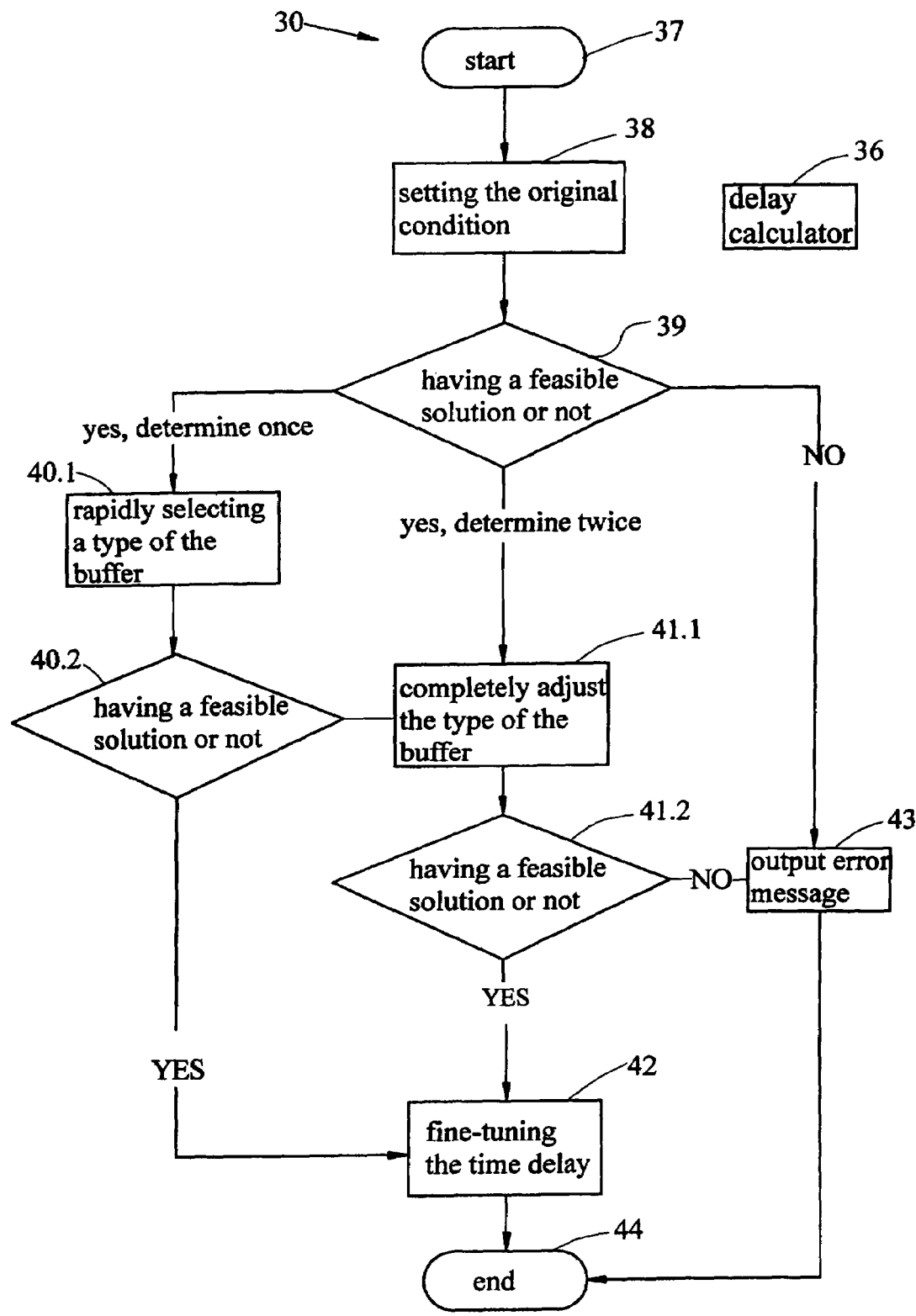
FIG. 4 is a block chart of a calculating method of displacing the buffer.

With reference to FIG. 4, the calculating tool 30 of rapidly selecting types of buffers of the clock tree contains the following modules: setting an original state 38, rapidly finding a feasible solution 39, rapidly adjusting the types of the clock tree 40.1, fully adjusting the types of the clock tree 41.1 and fine tuning the clock delay 42. Each module needs to use the delay calculator 36, because each module needs to process a path delay calculation.

In the following specification, some symbols need to be defined previously:

Cskew: the up limit of clock skew;

Pmax: the path in the clock tree having the biggest path delay, and the path is the clock delay;

Pmin: the path in the clock tree having the smallest path delay;

ΔD: clock skew=Pmax−Pmin;

Bp: collection of the buffers in one path p; and

Bp,q: the collection of the buffers in path p and path q.

The delay calculator has two important observing points as follows. To displace the type of any one buffer of the clock tree will cause change of the delay of the buffers 18. Delay of some or even all of the buffers may be changed, because the skew of the output signal may be transmitted to a load. In the process for finding the best solution of the algorithm of selecting the type of the buffers, the type of the buffers in the same place or in different places need to be continually displaced.

The timing design of the present invention corresponds to the calculating signal from the input end to the output end, that is, corresponds to the sum of the buffer delay and the path delay of one complete path from the root to the leaf. For the purpose of rapidly calculating the path delay, the argument of the circuit electricity is described by a reduced standard parasitic format (RSPF). At the time, the displacement buffer only influences the buffer delay without concerning the circuit delay.

Figure 5:
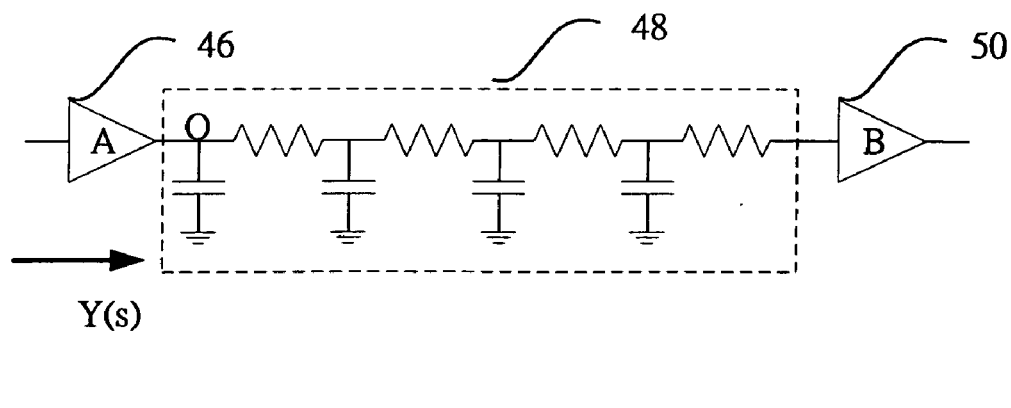
FIG. 5 shows a parasitism RC circuit in (a) and the circuit electricity parameter of RSPF in (b)
Figure 5:
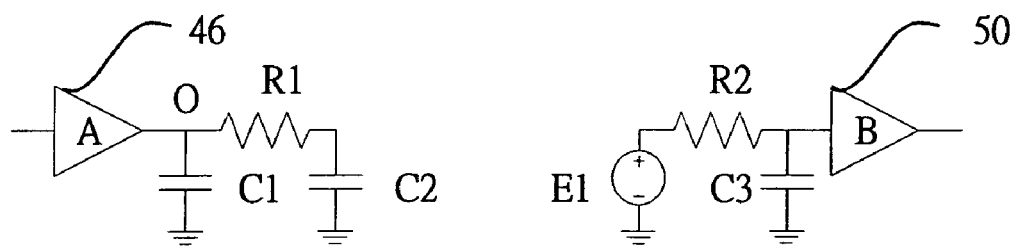
Figure 6:
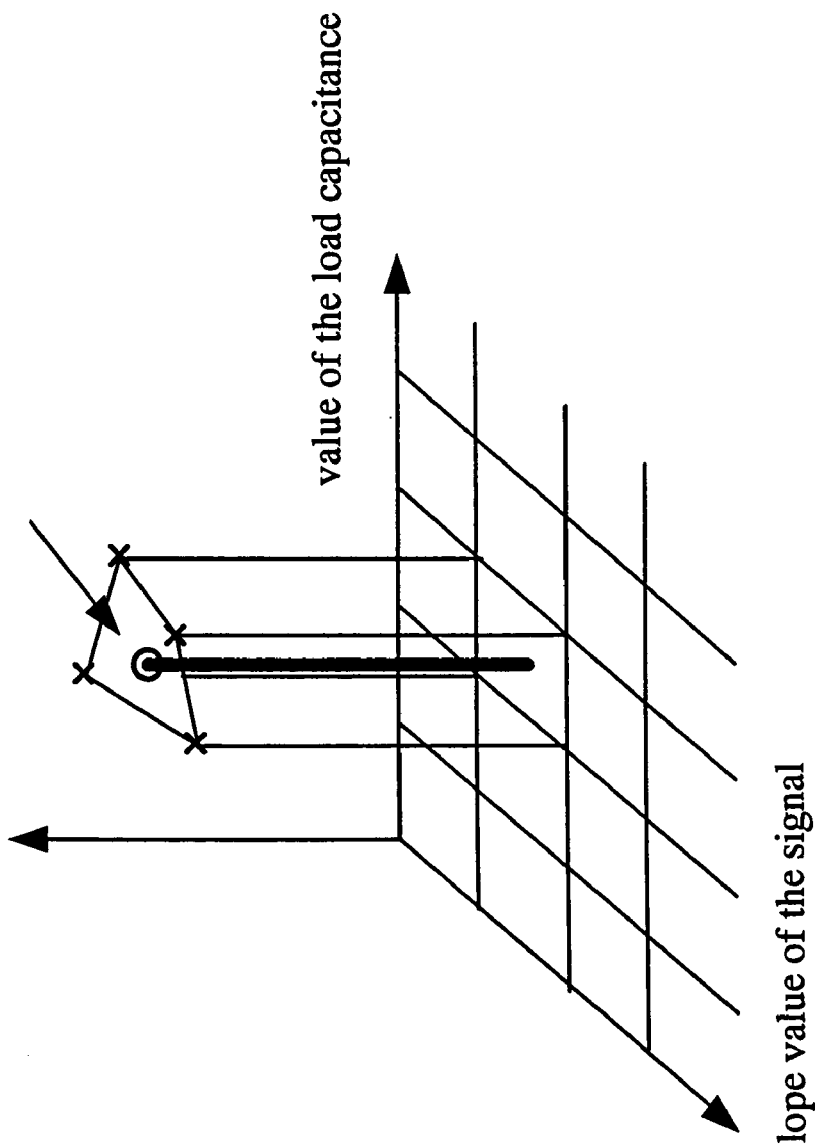
FIG. 6 is a signal view of a library check calculating the buffer delay and the slope of the output signal.

With reference to FIG. 5a, a parasitism RC circuit is set between the buffers 40 and 50, and has a function Y(s). With reference to FIG. 5b that shows the argument of the circuit electricity in RSPF, the PI model (R1, C1 and C2) is similar to the first three ranks of the Taylor's expansion and can be considered as an equivalent load of the buffer 46, and the total load of the circuit is the sum of C1 and C2. The pin-to-pin delay can be described by a simple RC mode and the circuit is R2*R3. The circuit delay and the buffer delay do not influence each other, because the electric parameter is decided by the input data. With reference to FIG. 6, the buffer delay value and the slope of the output signal can be gained by looking-up the timing data table. An approximate buffer delay value is calculated by sequentially using the slope value of the input signal and the load capacitance value for checking the buffer delay value of four corners of the buffer, and the piecewise linear interpolation for calculating an interpolation value. A method for calculating the slope value of the output signal is the same as the method for calculating the buffer delay value.

The pin capacitance of the buffer is changed when the type of the buffer is changed. With reference to the previous grade of the buffer output, the buffer delay is changed, because the load is changed. With reference to FIG. 5, the equivalent load of the buffer 48 is changed when the type of the buffer 50 is changed. Consequently, the delay of the two buffers 48 and 50 needs to be calculated again. The flip-flop of the synchronism system is used as a load of the last grade buffer. A buffer usually connects to multiple flip-flips, that is, the number of all the flip-flops is greater than that of the last grade buffer.

As described above, with reference to FIG. 7, the delay calculator in accordance with the present invention contains two calculating processes including calculating the buffer delay 36.1 and calculating the flip-flop delay 36.2 for respectively calculating the path delay in a different area of the clock tree structure. The buffers 54 and 58 are the load of the buffer 52, the buffer 56 is the load of the buffer 54, and the flip-flops 60 and 62 respectively are the loads of the buffers 56 and 58.

Figure 7:
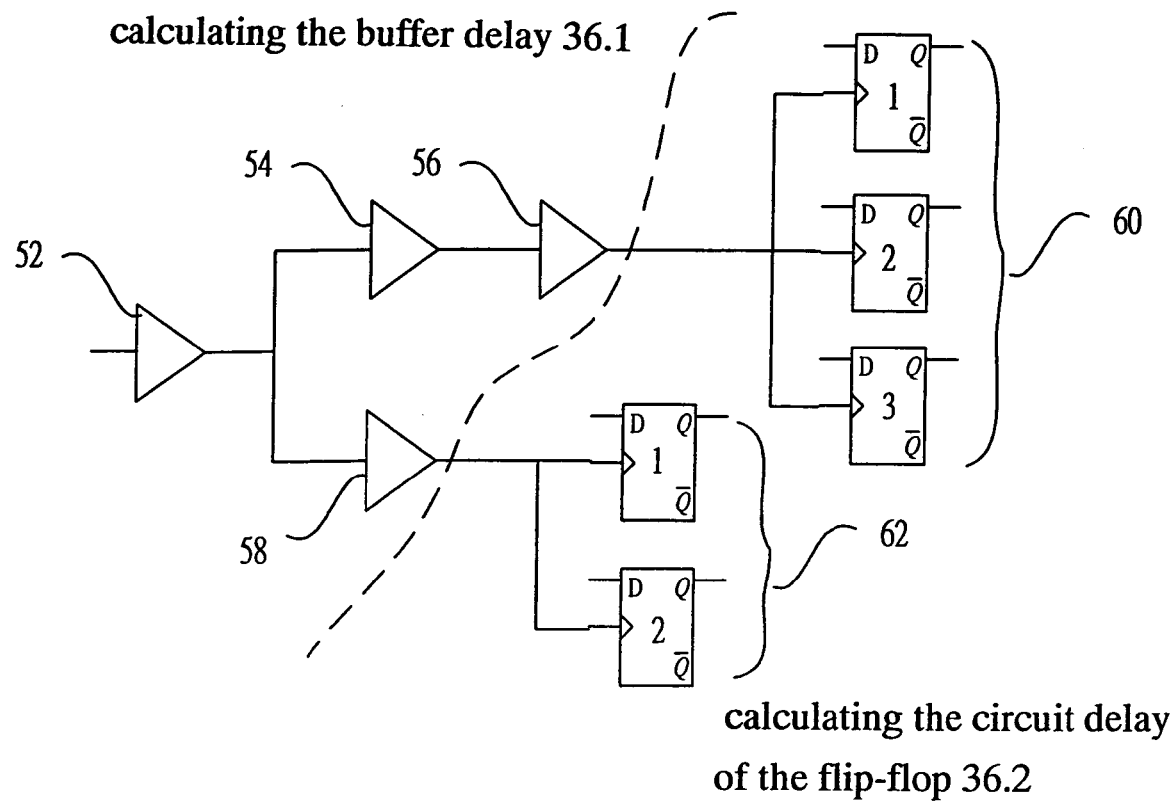
FIG. 7 shows a method of the delay calculator of the present invention.
Figure 8:
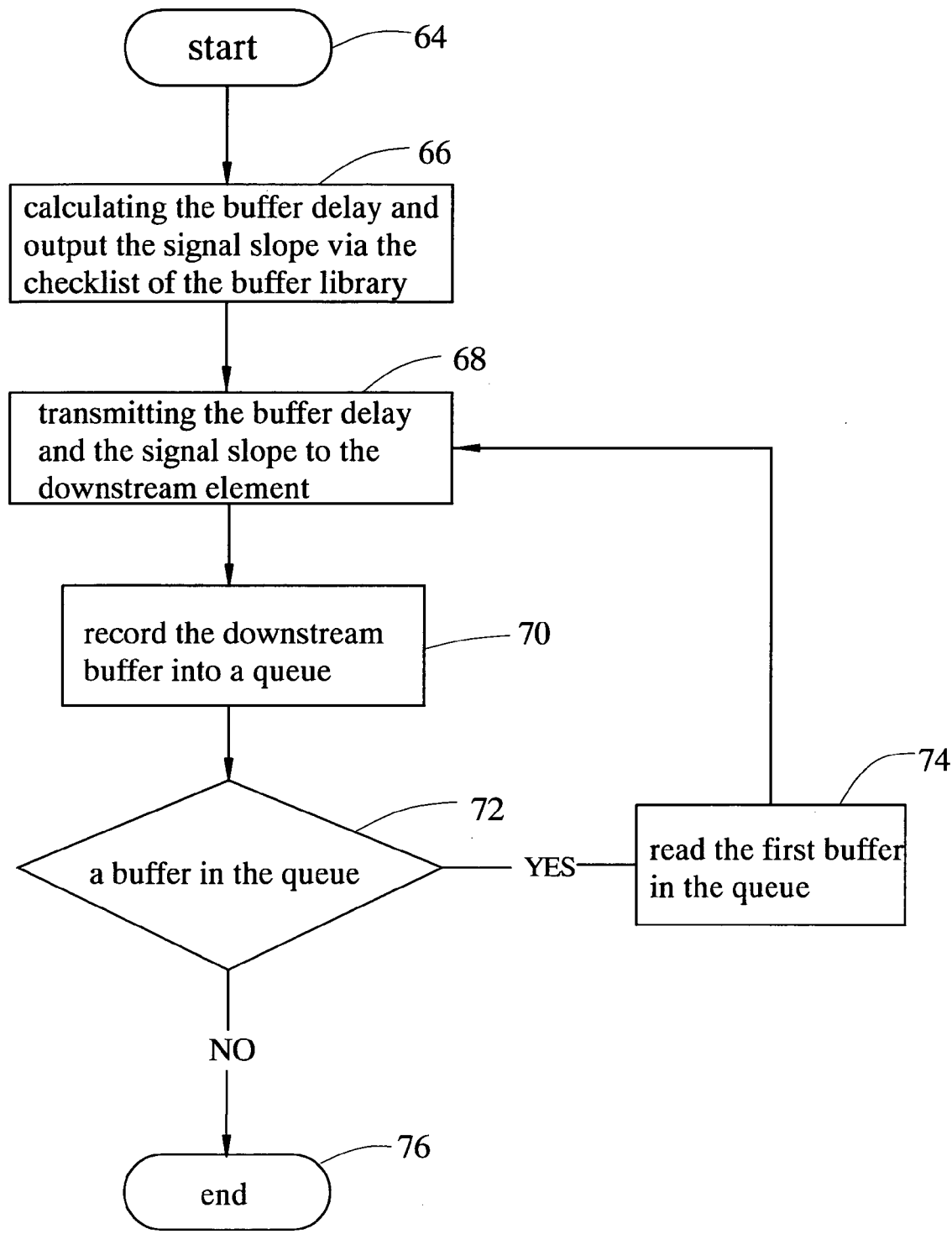
FIG. 8 is a flow chart of a buffer delay calculator of the present invention.

For calculating the buffer delay, the present invention is provided to calculate a new time delay when the time delays of some of the buffers are changed due to a change of the type or the load of the buffers in the clock tree. With reference to FIG. 8, the delays of the buffers 54 and 56 need to be calculated again when the type of the buffer 56 is changed. However, all of the buffers need to be calculated again when the type of the buffer 58 is changed. For saving the necessary time of calculating, the delay of the whole clock tree is calculated only when the type or the load the buffers of the root is changed. For transmitting the slope of the output signal and the changed path delay from the parent grade buffer to the children grade, the present invention combines the queue first-in-first-out of breadth-first search, as shown in FIG. 8. The clock tree as shown in FIG. 7, the type of the buffer 58 is changed in step 64. First, the parent grade buffer 52 of the buffer 58 is inputted. The step 66 afresh calculates the delay and the slope of the output signal of the buffer 52 by checking the timing data library. Step 68 renews the buffer delay and the slope of the input signal of the buffers 54 and 58. Step 70 records the buffers 54 and 58 in the queue. Step 72 determines two buffers in the queue, and the step 74 reads the buffer 54 and processes the step 66. The above steps are continually repeated until step 72 determines there is no buffer in the queue.

Figure 9:
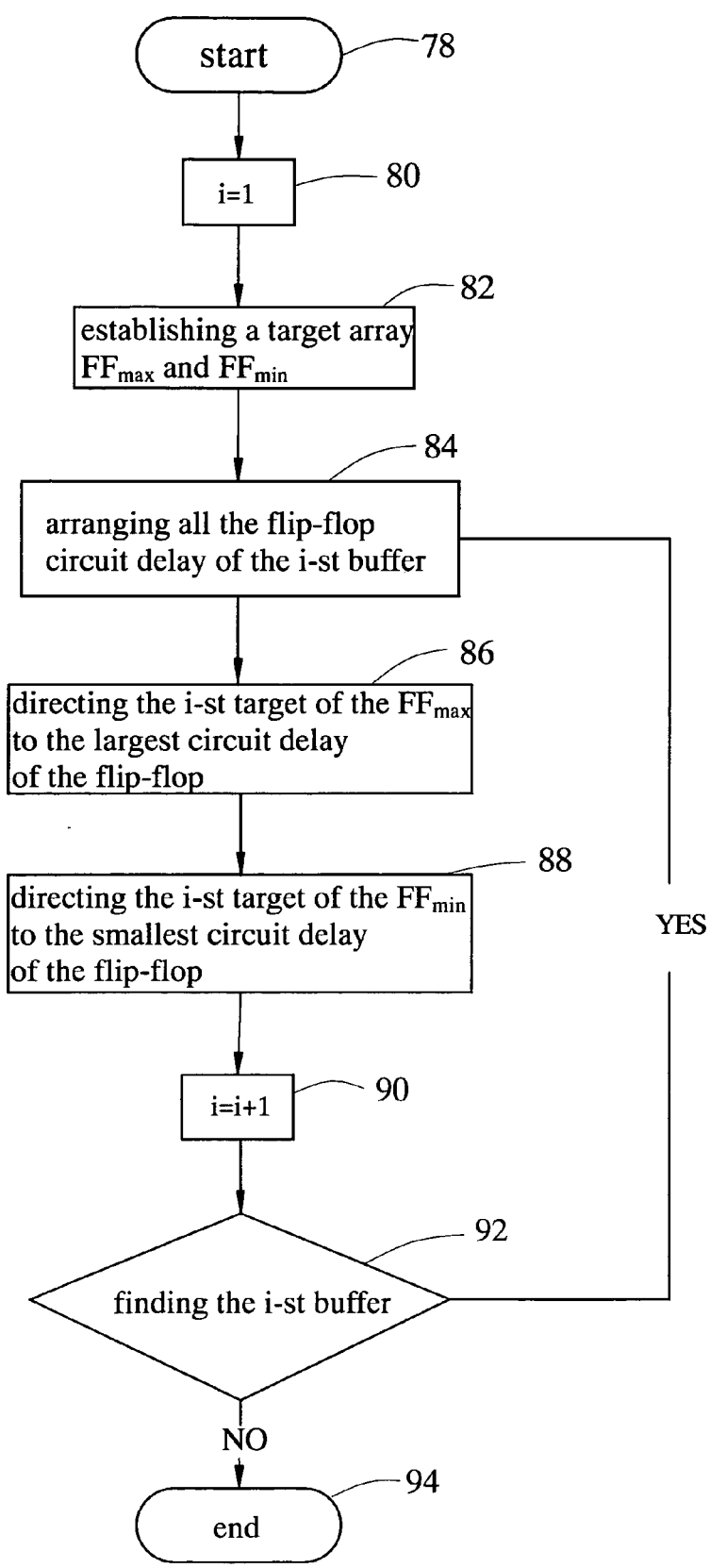
FIG. 9 is a flow chart of a flip-flop path delay calculator.

For calculating the path delay of the flip-flop, multiple flip-flops are used as a load of a corresponding one of the buffers such that the flip-flops have a same buffer delay from the root to the buffer. The difference of the paths is the only path delay of the flip-flops. As shown in FIG. 7, there are five paths. The flip-flop set 62 has a buffer delay from the buffers 52 and 58. However, the flip-flops 62.1 and 62.2 are not limited to havinig a same flip-flop path delay. Generally speaking, the clock signal receiving end of the flip-flop is the leaf of the clock tree, and the number of the flip-flop is equal to that of the path from the root of the clock tree to the clock signal receiving end of the flip-flops, because the delay value of the paths needs to be arranged in the buffer displacement calculating method. It will take a lot of time when the number of the paths is great. For shortening the calculating time and considering the design standard of the clock delay and the clock skew, the present invention only considers the maximum and the minimum of all the flip-flop path delays in one buffer. FIG. 9 shows the established method of the pointer array FFmax and FFmin of the flip-flop path delay of the present invention. There are two flip-flop sets 60 and 62. The FFmax directs to 60.1 and 62.1, and the FFmin directs to 60.3 and 62.2 when the flip-flop path delay 60.1>60.2>60.3 and 62.1>62.2 after being arranged in step 84. The two pointer arrays and the buffer delay calculating method are combined to a complete delay calculator.

There are n aggregated buffer delays and n flip-flop path delays with the maximum and the minimum when the clock tree has n lowest grade buffers. Each flip-flop path delay and the buffer delay thereof result in 2*n path delays, wherein the maximum is the Pmax and the difference between the Pmax and the Pmin is the ΔD (clock skew). The flip-flip path delay does not change due to the displacement of the buffer. Consequently, the system only needs to calculate the buffer delay, to renew path delay and to arrange the 2*n path delays.

Figure 10:
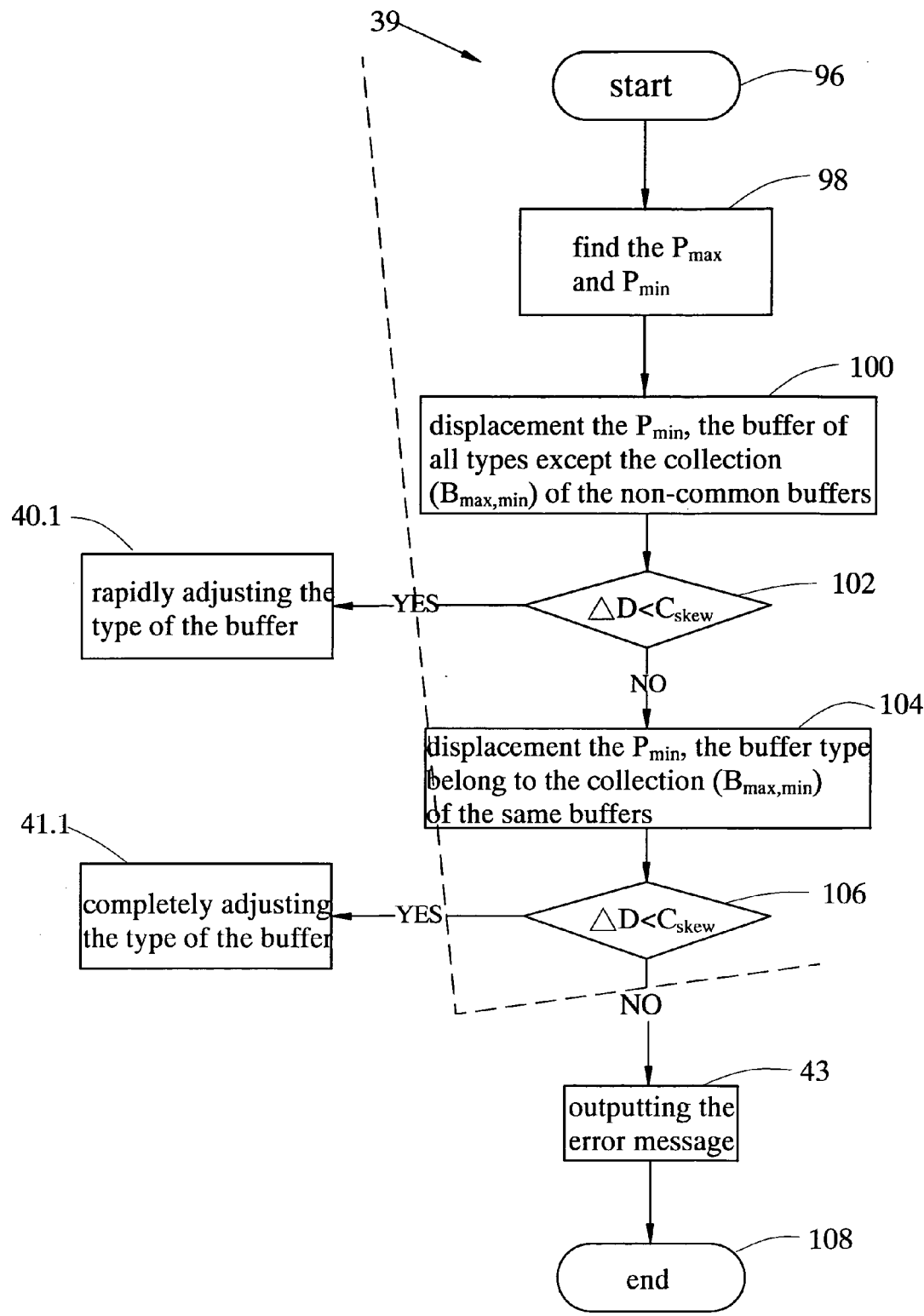
FIG. 10 is flow chart of the present invention for determining a feasible solution.

With reference to FIG. 4, the step 38 is to set the original condition. The purpose of the present invention is to minimize clock delay. The step 39 is to determine a feasible solution. Further with reference to FIG. 10, for rapidly a tree clock having no feasible solution, the present invention provides a determine function to rapidly determine a feasible solution focus of comparing ΔD of the Pmax with the ΔD of the Pmin. Step 100 is to sequentially displace the buffer on the Pmin path to a buffer with a type having a greatest delay from the leaf to the root to raise the path delay of the Pmin. The clock skew is reduced when the change of the buffer type of the Pmin does not influence the Pmax. The buffer delay and the slope of the output signal become sensitive when the slope of the input signal becomes great. The step 104 makes the buffer collect Bmax and Bmin of the paths of Pmax and Pmin to have a small size. Consequently, the clock delay is increased, and the slope of the output signal of the buffer collect Bmax and Bmin is increased. With reference to FIG. 7, the clock tree has two equivalent paths respectively connected to the buffer 56 and buffer 58 via the buffer 52 such that the buffer 52 is the buffer collect Bmax and Bmin of the buffers 56 and 58, because the buffer type of the Pmin is the greatest delay. Consequently, the increasing range of the path delay of Pmin may be greater than that of Pmax, that is, the clock skew may be decreased.

The present invention uses the spirit of the branch-and-bound for rapidly adjusting the buffer type 40. The branch-and bound calculating method can lock some of the variables and ignore the other variables by establishing a branch-and-bound tree for removing some unreasonable solutions, even the subtree of the branch. The variables are arranged due to the importance thereof. The important variable is set on the upper layer of the branch-and-bound tree and firstly considered for promoting the calculating effect.

To affirm a feasible solution is the premise for entering the calculating method for rapidly adjusting the type of buffers. The sequences of the variables accord with the position of the buffer in the clock tree and the type of the buffer. In addition, the present invention focuses on the following principles when selecting the type of displacement:

1. The buffer of the Pmin with a minimum path delay is firstly considered for increasing the path delay.

2. The type of the children grade of the buffer is firstly selected relative to the parent grade buffer, because the influence area of the children grade buffer is smaller than that of the parent grade buffer.

3. The type with a minimum delay is directly displaced by the type with a maximum delay when selecting the type of buffer after the path and the position of the buffer being decided for reducing the times for displacing the buffer.

Figure 11:
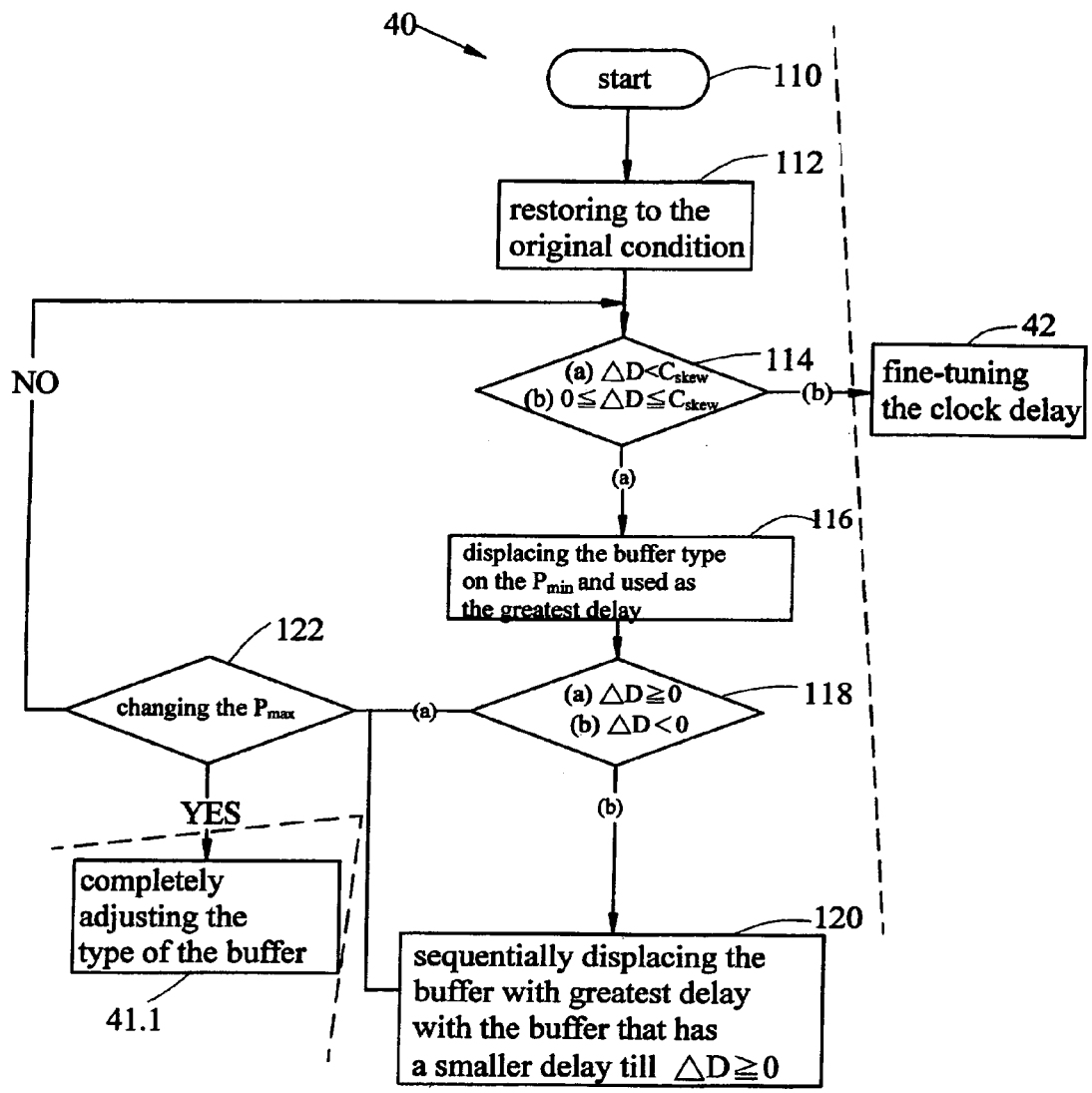
FIG. 11 is a flow chart of a calculating method of rapidly adjusting the type of the buffer.

FIG. 11 shows a flow chart of the present invention. The step 112 is back to the original condition, and, then, all the types of the buffers have a minimum delay. The fine tuning process 42 of the clock delay is processed for shortening the time of solution when the step 114 determines that the original condition conforms to the condition limits. The type of some of the buffers needs to be adjusted when the original condition does not conform to the condition limits. In step 116, the Pmax is maintained such that the path delay of the Pmax is the maximum relative to all of the paths. The path of the Pmin is selected in every time of arrangement and one of the buffers to be a type having a maximum delay for increasing the path delay thereof and reducing the clock skew. Step 118 is used to determine that the path delay of the Pmin may be greater than that of the Pmax. The step 120 is provided to gradually reduce the path delay of the Pmin when greater than that of the Pmax to make the path delay of the Pmax be greater or equal to that of the Pmin and the ΔD be smaller than the Cskew. The path delay needs to be renewed and the Pmax and the Pmin needs to be found for calculating the ΔD when the steps 112, 116 and 120 adjust the type of the buffers.

Step 122 of the present invention is provided to determine the change of the Pmax to prevent a special condition as follows. One path P and the Pmin have a shared buffer collection Bp,min except the root and the path delay of P is near that of the Pmax. The path delay of the Pmin is increased according to the steps of the calculating method. The shared buffer collection Bp,min of the paths P and Pmin is changed and make the path delay of P greater than that of the Pmax. In this time, the non-shared buffer collection of P and Pmin may be adjusted to reduce the path delay of P. However, this adjustment may cause a series of changes of the buffers on other paths, even an infinite loop. Under the above condition, the adjusting buffer calculating method 40 is stopped. and a complete adjusting buffer calculating method 41 is provided. In addition, steps 114 and 122 can be combined to the step 40.2 in FIG. 3 for determining the condition of the displacement buffer calculation.

With reference to FIG. 4, in the complete adjusting buffer calculating method 41, some special cases cited in the steps 39 and 40 may be feasible. However, they are not suitable to the step 40. They violate the limit of the clock skew because the Pmax, in the present invention, is stably maintained in the original condition. For solving the problem of steps 39 and 40, to minimize clock delay, the present invention is amended to minimize clock skew.

Figure 12:
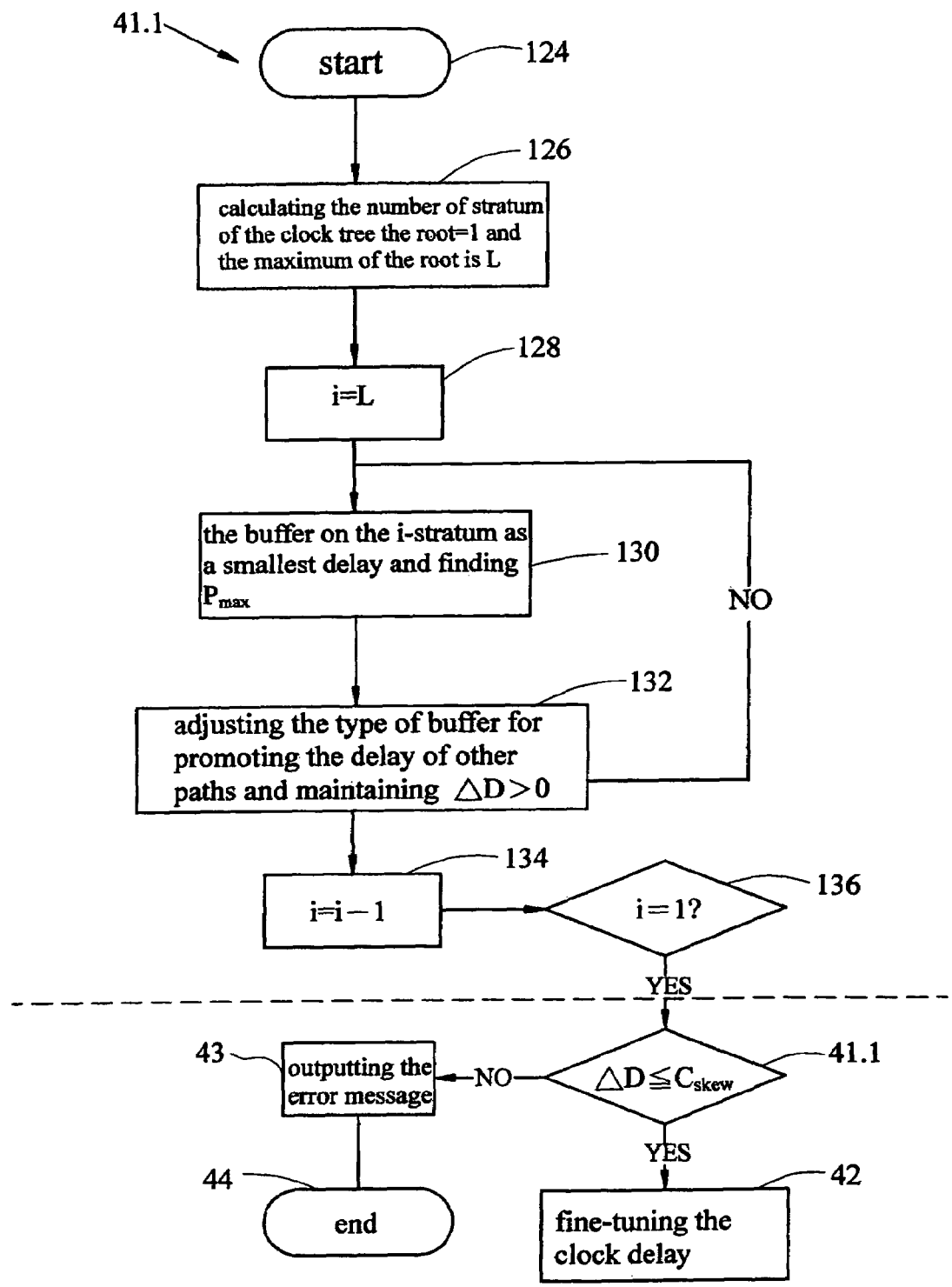
FIG. 12 is a flow chart of a calculating method of complete adjusting the type of the buffer.

With reference to FIG. 12, in the complete adjusting buffer calculating method 41, the step 126 is provided to calculate the number of the stratum of the clock tree. The stratum of the root is defined as 1, and the stratum of the low-grade buffer is sequentially defined as 2. The maximum number of stratum is calculated to be L by Depth-first Search. Step 130 is provided to set the type of the buffer from i stratum to minimize the buffer delay and select the Pmax, and, then, the path only contains the buffers from the i stratum to the L stratum. In step 132 adjusting the type of the buffers from the big stratum to the small stratum, the short path will select the buffer with a greater delay, and the long path may maintain the original buffer.

As to the clock delay fine tuning 42, the calculating method is provided to reduce the clock delay by fine tuning some of the buffers, and the general idea is from the delay calculator. The buffer delay and the path delay will become smaller when the load of the buffer becomes smaller. For minimizing the clock delay, all the buffers on the Pmax is adjusted to have a minimum size without changing the buffers on the Pmax and increasing the clock skew. As a result, the load of buffers on the Pmax is decreased, because the equivalent input pin capacitance is decreased.

Using the steps in FIG. 3, the information and the results of five embodiments of the present invention are shown in table 1. Supposing the upper limit 140 of the clock skew of the five embodiments being set as 0.3 ns, the buffer timing library 142 provides four types of buffers for selection and the netlist of the clock tree of each of the five embodiments are different from one another. There is no output result of the clock delay and the clock skew, because the first and the fifth embodiments are not suitable to the upper limit of the clock skew. To compare the output result of the clock tree netlist after being renewed, the clock delay and the clock skew has been effectively improved.

Although the invention has been explained in relation to its preferred embodiment, it is to be understood that many other possible modifications and variations can be made without departing from the spirit and scope of the invention as hereinafter claimed.

What is claimed is:

1. A method and apparatus for high-speed very-large-scale-integration comprising:
   (a) inputting a clock tree netlist of a clock tree having at least two paths having buffers, with the clock tree netlist including an electricity parameter of each of the paths and a buffer timing library;
   (b) inputting an upper limit of a clock skew;
   (c) preparing a delay calculator for calculating a clock delay of each of the paths of the clock tree netlist; and
   (d) preparing a calculating method for rapidly selecting types of buffers, outputting a minimized clock delay and conforming to a best clock tree netlist of the clock skew when conforming to the upper limit of the clock skew, wherein the delay calculator comprises:
   a buffer delay calculator for calculating the delay of an original path and the delay after displacing the type of the buffer and renewing the path between the connections of the buffers; and
   a flip-flop path delay calculator for recording the delay of a connection between the buffer and a flip-flop and for calculating the clock delay and the clock skew.

2. A method and apparatus for high-speed very-large-scale-integration comprising:
   (a) inputting a clock tree netlist of a clock tree having at least two paths having buffers, with the clock tree netlist including an electricity parameter of each of the paths and a buffer timing library;
   (b) inputting an upper limit of a clock skew;
   (c) preparing a delay calculator for calculating a clock delay of each of the paths of the clock tree netlist; and
   (d) preparing a calculating method for rapidly selecting types of buffers, outputting a minimized clock delay and conforming to a best clock tree netlist of the clock skew when conforming to the upper limit of the clock skew, wherein the calculating method comprises:
   (a) setting an original condition of each of the buffers;
   (b) rapidly determining whether a feasible solution suitable to the clock skew exists or not;
   (c) completing the calculating method of adjusting the buffer type and fine tuning the clock delay for getting a minimum clock delay and outputting a renewed clock tree netlist when having the feasible solution exists; and
   (d) stopping the calculating method when no feasible solution exists.

3. The method as claimed in claim 2, wherein the calculating method uses a branch-and-bound calculating method for rapidly adjusting the types of buffers and locking some variables and ignoring other variables by establishing a branch-and-bound tree.

* * * * *